United States Patent
Wang et al.

(10) Patent No.: US 9,263,273 B2
(45) Date of Patent: Feb. 16, 2016

(54) METHOD FOR MANUFACTURING SEMICONDUCTOR DEVICE

(71) Applicant: Semiconductor Manufacturing International (Shanghai) Corporation, Shanghai (CN)

(72) Inventors: Haiqiang Wang, Shanghai (CN); Xianyong Pu, Shanghai (CN); Yong Cheng, Shanghai (CN); Zonggao Chen, Shanghai (CN); Yiqun Chen, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/626,649

(22) Filed: Feb. 19, 2015

(65) Prior Publication Data

US 2015/0262820 A1  Sep. 17, 2015

(30) Foreign Application Priority Data

Mar. 11, 2014 (CN) .......................... 2014 1 0088290

(51) Int. Cl.
| | | |
|---|---|---|
| H01L 21/266 | (2006.01) | |
| H01L 21/8238 | (2006.01) | |
| H01L 29/66 | (2006.01) | |
| H01L 29/167 | (2006.01) | |
| H01L 21/306 | (2006.01) | |
| H01L 21/308 | (2006.01) | |
| H01L 21/762 | (2006.01) | |

(52) U.S. Cl.
CPC .......... *H01L 21/266* (2013.01); *H01L 21/3081* (2013.01); *H01L 21/30604* (2013.01); *H01L 21/76224* (2013.01); *H01L 21/823878* (2013.01); *H01L 21/823892* (2013.01); *H01L 29/167* (2013.01); *H01L 29/66681* (2013.01)

(58) Field of Classification Search
None
See application file for complete search history.

(56) References Cited

U.S. PATENT DOCUMENTS

| | | | | |
|---|---|---|---|---|
| 2014/0151794 A1* | 6/2014 | Lotfi | ................... | H01L 23/4824 257/337 |
| 2014/0225191 A1* | 8/2014 | Lotfi | .................... | H01L 21/761 257/337 |

* cited by examiner

*Primary Examiner* — Stanetta Isaac
(74) *Attorney, Agent, or Firm* — Innovation Counsel LLP

(57) ABSTRACT

A method for manufacturing a semiconductor device may include the following steps: preparing a semiconductor substrate that includes a first substrate region, a second substrate region, and a third substrate region; providing a first mask that overlaps the semiconductor substrate; etching, using the first mask, the first semiconductor substrate to form a trench in each of the substrate regions; providing a second mask that overlaps the semiconductor substrate and includes three openings corresponding to the substrate regions; performing first ion implantation through the three openings to form a P-doped region in each of the substrate regions; performing second ion implantation through the three openings to form an N-doped region in each of the substrate regions; and performing third ion implantation through the three openings to form another N-doped region in each of the substrate regions; and forming an isolation member in each of the trenches.

20 Claims, 5 Drawing Sheets

Isolated LDNMOS

Non-isolated LDNMOS

LDPMOS

FIG. 1

Isolated-LDNMOS region

Non-isolated-LDNMOS region

LDPMOS region

FIG. 2A

Isolated-LDNMOS region

Non-isolated-LDNMOS region

LDPMOS region

FIG. 2B

Isolated-LDNMOS region

Non-isolated-LDNMOS region

LDPMOS region

METHOD FOR MANUFACTURING SEMICONDUCTOR DEVICE

CROSS-REFERENCE TO RELATED APPLICATION

This application claims priority to and benefit of Chinese Patent Application No. 201410088290.X, filed on 11 Mar. 2014, the Chinese Patent Application being incorporated herein by reference in its entirety.

BACKGROUND OF THE INVENTION

The present invention is related to a method for manufacturing a semiconductor device.

Laterally diffused metal oxide semiconductor (LDMOS) devices may have advantages related to gain, linearity, switching performance, thermal performance, etc. Therefore, LDMOS devices may be widely used in various electronic devices, such as telecommunication devices.

Typically, a semiconductor device that includes LDMOS devices may need to include at least an isolated N-type LDMOS (or isolated LDNMOS) device, a non-isolated N-type LDNMOS (or non-isolated LDNMOS) device, and a P-type LDMOS (or LDPMOS) device. The semiconductor device may further include one or more other devices, such as a complementary metal-oxide-semiconductor (CMOS) device. Separate mask processes for forming the isolated LDNMOS device, the non-isolated LDNMOS device, and the LDPMOS device may significantly add to the manufacturing cost of the semiconductor device.

SUMMARY

An embodiment of the present invention may be related to a method for manufacturing a semiconductor device. The method may include the following steps: preparing a semiconductor substrate that includes a first region for forming an isolated LDNMOS device, a second region for forming a non-isolated LDNMOS device, and a third region for forming an LDPMOS device; providing a first mask that overlaps the semiconductor substrate; etching, using the first mask, the first semiconductor substrate to form a first trench in the first region, a second trench in the second region, and a third trench in the third region; providing a second mask that overlaps the semiconductor substrate and includes three openings respectively corresponding to the first region, the second region, and the third region; performing first ion implantation through the three openings to form a first P-doped region in the first region, a second P-doped region in the second region, and a third P-doped region in the third region; performing second ion implantation through the three openings to form a first N-doped region in the first region, a second N-doped region in the second region, and a third N-doped region in the third region; performing third ion implantation through the three openings to form a fourth N-doped region in the first region, a fifth N-doped region in the second region, and a sixth N-doped region in the third region; and forming a first isolation member in the first trench, a second isolation member in the second trench, and a third isolation member in the third trench.

One or more of the three openings may partially expose the first mask.

The first ion implantation may provide an arsenic dopant and may have a junction depth less than a thickness of the first mask in a direction perpendicular to the bottom surface of the semiconductor substrate. The second ion implantation may provide a phosphorus dopant. The third ion implantation may provide a boron dopant and may have a junction depth greater than the thickness of the first mask. The bottom surface of the semiconductor substrate may be opposite to at least one gate electrode.

The first mask may include and/or may be made of a silicon nitride material. The second mask may include and/or may be made of a photoresist material.

The first N-doped region and the fourth N-doped region may form an N-drift region of the isolated LDNMOS device.

The first P-doped region may form a deep P-well of the isolated LDNMOS device.

The second N-doped region and the fifth N-doped region may form an N-drift region of the non-isolated LDNMOS device.

The method may include forming a first deep N-well in the first region and a second deep N-well in the third region prior to formation of the first trench, the second trench, and the third trench.

The method may include the following steps (which may be formed after formation of the first isolation member, the second isolation member, and the third isolation member): forming an N-well in the third region; forming a first P-well in the first region; forming a second P-well in the second region; and forming a third P-well in the third region, wherein the third P-well may directly contact the third P-doped region.

The third P-well and the third P-doped region may form a P-drift region of the LDPMOS device.

The method may include the following step (which may be performed after formation of the N-well, the first P-well, the second P-well, and the third P-well): forming a gate electrode, a source electrode, and a drain electrode at each of the first region, the second region, and the third region.

The first P-well may directly contact at most one side of the first P-doped region and/or may not be positioned between two portions of the first P-doped region.

The second P-well may directly contact at most one side of the second P-doped region and/or may not be positioned between two portions of the first P-doped region.

A minimum distance between the N-well and the bottom surface of the semiconductor substrate may be greater than a minimum distance between the third P-doped region and the bottom surface of the semiconductor substrate.

At least one of the third N-doped region and the sixth N-doped region may be positioned between the N-well and the third P-well.

A portion of the third P-doped region may be positioned between the N-well and the third P-well.

The method may include the following steps: depositing a dielectric material in the first trench, the second trench, and the third trench; and removing a portion of the dielectric material through a chemical-mechanical polishing process to form the first isolation member, the second isolation member, and the third isolation member.

Positions of the three openings may respectively overlap positions of the first trench, the second trench, and the third trench.

The first N-doped region may be positioned between the first P-doped region and the fourth N-doped region.

The fourth N-doped region may be positioned between the first isolation member and the first N-doped region.

In comparison with well-known methods for manufacturing semiconductor devices (such as the method discussed with reference to FIG. 1), embodiments of the invention may require fewer mask processes. Advantageously, embodiments of the invention may significantly simplify semiconductor device manufacturing processes and may significantly reduce semiconductor device manufacturing costs.

The above summary is related to one or more of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
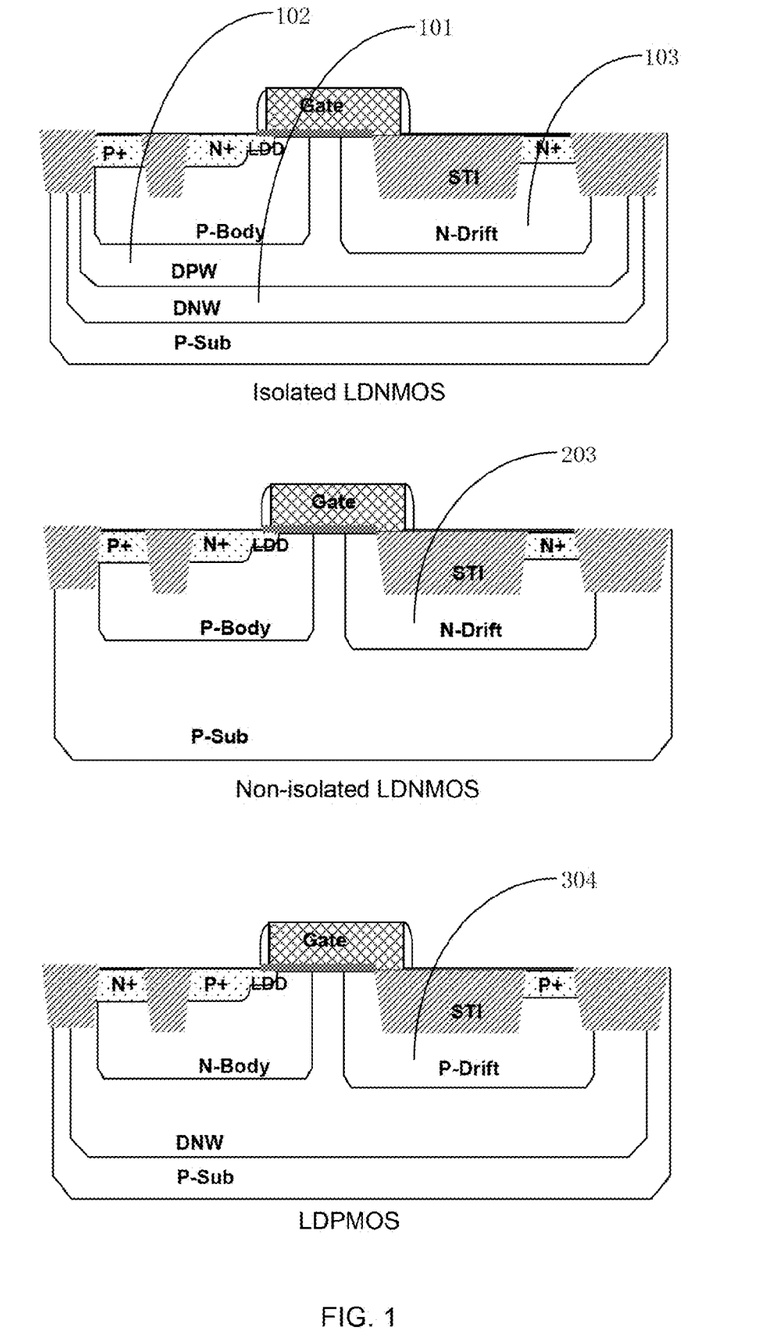
FIG. 1 shows a schematic cross-sectional view that illustrates elements and structures of a semiconductor device in accordance with an embodiment of the present invention.

FIG. 1 shows schematic cross-sectional views that illustrate elements and structures of a semiconductor device that includes an isolated LDNMOS device, a non-isolated LDNMOS device, and a LDPMOS device in accordance with an embodiment of the present invention. For manufacturing the semiconductor device, one or more mask processes may be performed for formation of the deep P-well 102 (or DPW 101) in the isolated LDNMOS, formation of the deep N-well 101 (or DNW 101) in the isolated LDNMOS, formation of both the N-drift region 103 in the isolated LDNMOS and the N-drift region 203 in the non-isolated LDNMOS, and formation of the P-drift region 304 in the LDPMOS.

Figure 2A:
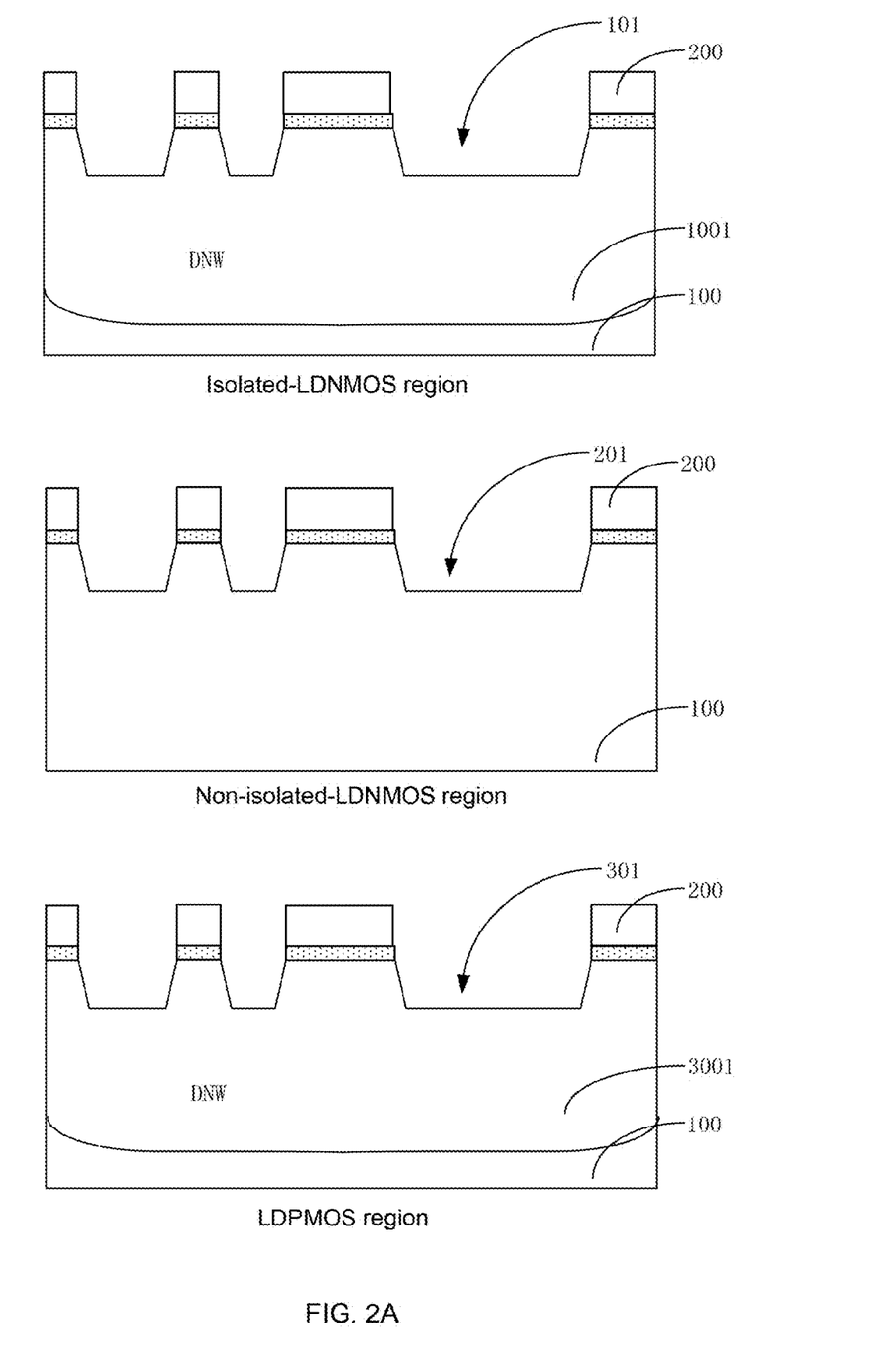
FIG. 2A, FIG. 2B, and FIG. 2C show schematic cross-sectional views that illustrate structures formed in a method for manufacturing a semiconductor device in accordance with an embodiment of the present invention.
Figure 2B:
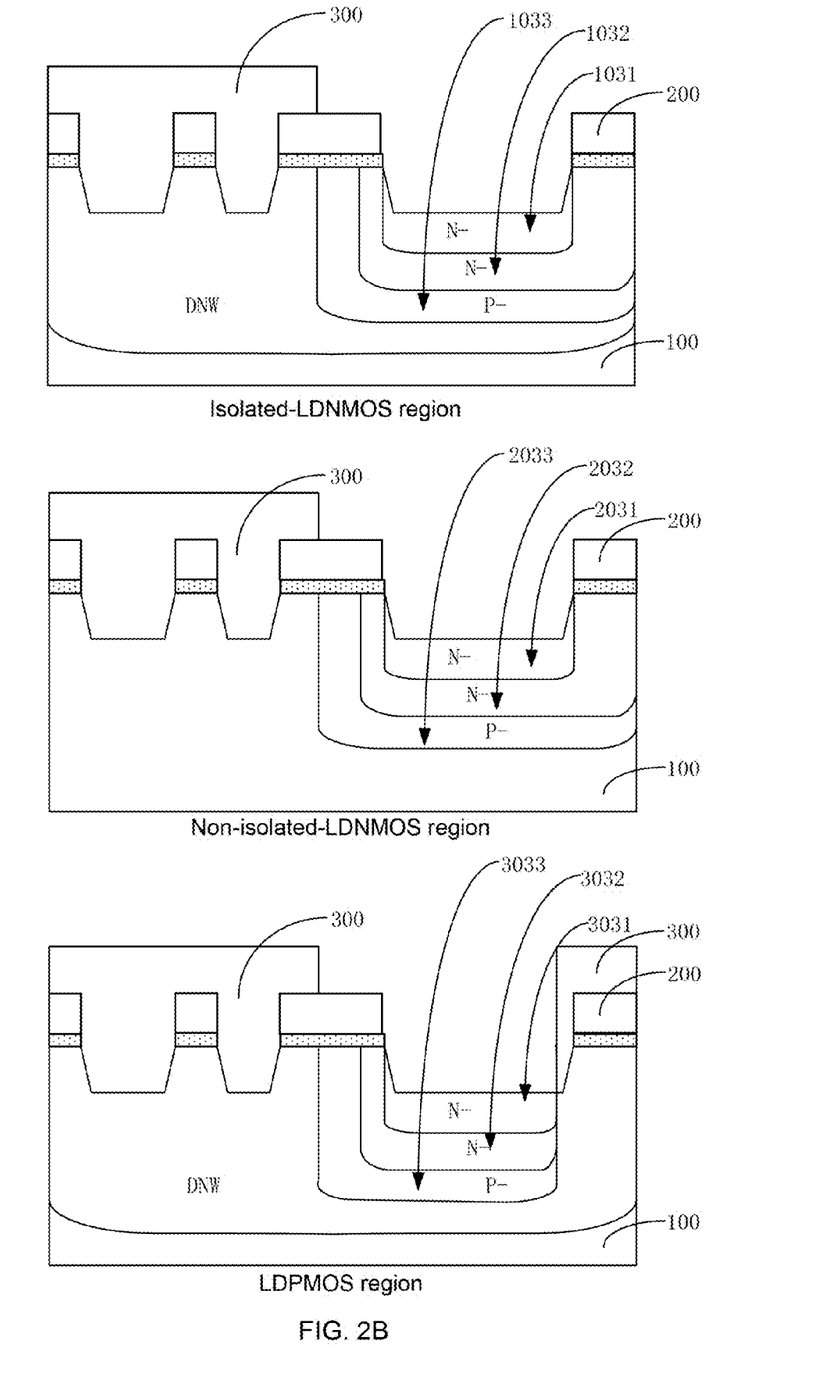
Figure 2C:
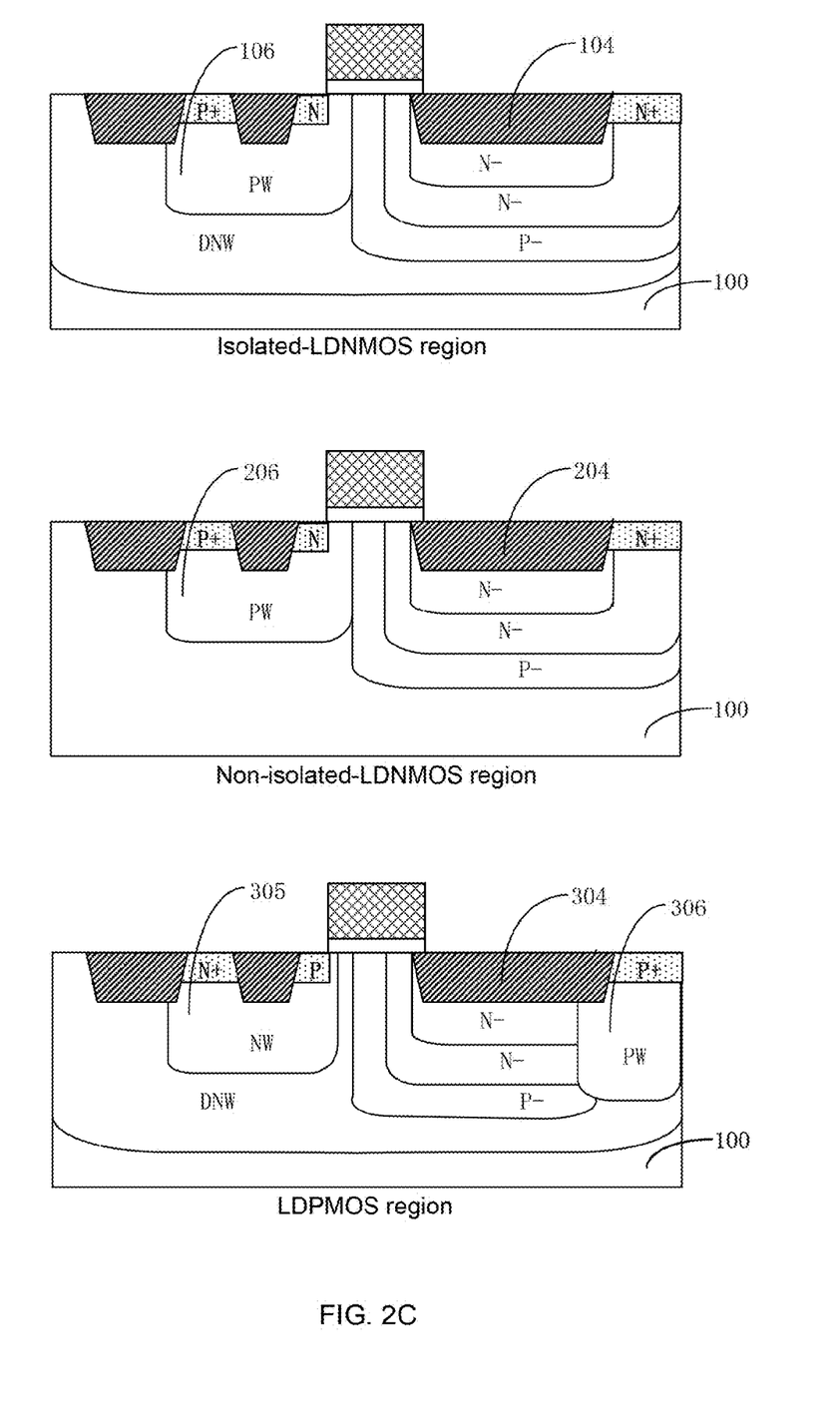
Figure 3:
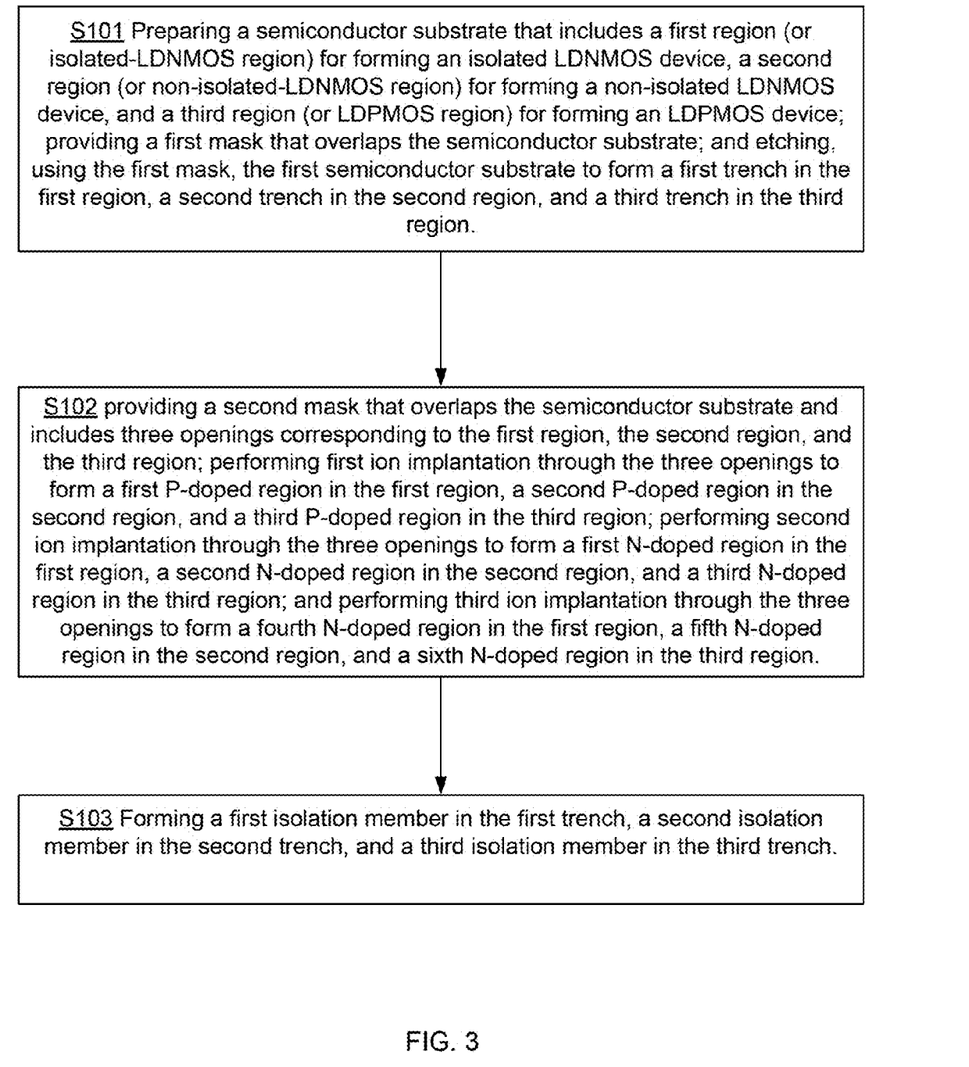
FIG. 3 shows a flowchart that illustrates a method for manufacturing a semiconductor device in accordance with an embodiment of the present invention.

FIG. 2A, FIG. 2B, and FIG. 2C, show schematic cross-sectional views that illustrate structures formed in a method for manufacturing the semiconductor device in accordance with an embodiment of the present invention. FIG. 3 shows a flowchart that illustrates a method for manufacturing a semiconductor device, for example, the semiconductor device related to FIGS. 2A to 2C, in accordance with an embodiment of the present invention.

Referring to FIG. 3, the method may include a step S101, a step S102, and a step S103.

Referring to FIG. 3 and FIG. 2A, the step S101 may include the following sub-steps: preparing a semiconductor substrate 100 that that may be a P-type substrate and may include three substrate regions—a first region (or isolated-LDNMOS region) for forming an isolated LDNMOS device, a second region (or non-isolated-LDNMOS region) for forming a non-isolated LDNMOS device, and a third region (or LDPMOS region) for forming an LDPMOS device; forming, by implanting ions in the semiconductor substrate 100, a first deep N-well 1001 in the isolated-LDNMOS region and a second deep N-well 3001 in the LDPMOS region; providing a first mask 200 that overlaps the semiconductor substrate 100; and etching, using the first mask 200, the first semiconductor substrate 100 to form a first trench 101 in the isolated-LDNMOS region, a second trench 201 in the non-isolated-LDNMOS region, and a third trench 301 in the LDPMOS region.

The first mask 200 may have a single-layer structure or multilayer structure. The first mask 200 may include a silicon nitride (SiN) material.

Referring to FIG. 3 and FIG. 2B, the step S102 may include the following sub-steps: providing a second mask 300 that overlaps the semiconductor substrate 100 and may include three openings respectively corresponding to the isolated-LDNMOS region (and the first trench 101), the non-isolated-LDNMOS region (and the second trench 201), and the LDPMOS region (and the third trench 301); performing first ion implantation through the three openings to form a first P-doped region 1033 in the isolated-LDNMOS region, to form a second P-doped region 2033 in the non-isolated-LDNMOS region, and to form a third P-doped region 3033 in the LDPMOS region; performing second ion implantation through the three openings to form a first N-doped region 1032 on the first P-doped region 1033 and in the isolated-LDNMOS region, to form a second N-doped region 2032 on the second P-doped region 2033 and in the non-isolated-LDNMOS region, and to form a third N-doped region 3032 on the third P-doped region 3033 and in the LDPMOS region; and performing third ion implantation through the three openings to form a fourth N-doped region 1031 on the first N-doped region 1032 and in the isolated-LDNMOS region, to form a fifth N-doped region 2031 on the second N-doped region 2032 and in the non-isolated-LDNMOS region, and to form a sixth N-doped region 3031 on the third N-doped region 3032 and in the LDPMOS region.

The second mask 300 may include a photoresist material. The second mask 300 may overlap a portion of the first deep N-well 1001 and a portion of the second deep N-well 1001. The second mask 200 may extend into one or more other trenches in one or more of the three substrate regions but not the first trench, the second trench, or the third trench. At least one of the three openings of the second mask 300 may partially expose the first mask 200. In an embodiment, each of the three openings may partially expose the first mask 200.

The first ion implantation may provide heavy atoms as dopants. For example, the first ion implantation may provide arsenic (As) dopants. A junction depth associated with the first implantation may be less than a thickness of the first mask 200 (e.g., a silicon nitride mask) in a direction perpendicular to (the bottom surface of) the semiconductor substrate 100.

The second ion implantation may provide phosphorus (P) dopants. A junction depth associated with the second ion implantation may be greater than, less than, or substantially equal to the thickness of the first mask 200 (e.g., a silicon nitride mask).

The third ion implantation may provide boron (B) dopants. A junction depth associated with the third ion implantation may be or preferably be greater than the thickness of the first mask 200 (e.g., a silicon nitride mask).

In an embodiment, the first mask 200 may be removed before the first ion implantation, the second ion implantation, and the third ion implantation.

The first N-doped region 1032 and the fourth N-doped region 1031 (in combination) may form (and function as) an N-drift region of the isolated LDNMOS device. The first P-doped region 1033 may form (and function as) a deep P-well of the isolated LDNMOS device. The second N-doped region 2032 and the fifth N-doped region 2031 (in combination) may form (or function as) an N-drift region of the non-isolated LDNMOS device. The third P-doped region 3033, in combination with a subsequently formed P-well 306 (illustrated in FIG. 2C), may form (and function as) a P-drift region of the LDPMOS device. The P-well 306 may be formed when a P-well 106 (illustrated in FIG. 2C) is formed in the isolated-LDNMOS region and when a P-well 206 (illustrated in FIG. 2C) is formed in the non-isolated-LDNMOS region without requiring any additional process steps or additional masks.

As can be appreciated from the foregoing discussion, in comparison with well-known methods for manufacturing semiconductor devices having LDMOS devices (such as the method discussed with reference to FIG. 1), embodiments of the invention may require fewer mask processes. Advantageously, embodiments of the invention may significantly simplify semiconductor device manufacturing processes and may significantly reduce semiconductor device manufacturing costs.

Referring to FIG. 3 and FIG. 2C, the step S103 may include forming a first isolation member 104 (e.g., a shallow trench isolation member or STI member) in the first trench 101, a second isolation member 204 (e.g., a shallow trench isolation member or STI member) in the second trench 201, and a third isolation member 204 (e.g., a shallow trench isolation member or STI member) in the third trench 301.

In an embodiment, the step S103 may include the following sub-steps: depositing a dielectric material in the first trench 101, the second trench 201, and the third trench 301; and removing an unwanted portion of the dielectric material through a chemical-mechanical polishing (CMP) process to form the first isolation member 104, the second isolation member 204, and the third isolation member 204.

The method may further include the followings steps (which may be performed after formation of the first isolation member 104, the second isolation member 204, and the third isolation member 204): forming an N-well 305 in the LDPMOS region, wherein the N-well 305 may be formed in the second deep N-well 3001; in a same process step, substantially forming a first P-well 106 in the isolated-LDNMOS region, forming a second P-well 206 in the non-isolated-LDNMOS region, and forming a third P-well 306 in the LDPMOS region.

The third P-well 306 may contact the third P-doped region 3033. The third P-well 306 and the third P-doped region 3033 in combination may form (and function as) a P-drift region of the LDPMOS device.

The third P-well 306 may be formed when the first P-well 106 is formed in the isolated-LDNMOS region and when the second P-well 206 is formed in the non-isolated-LDNMOS region without requiring any additional process steps or additional masks, such that substantially no additional cost may be incurred.

The method may further include the following steps (which may be performed after formation of the N-well 305, the first P-well 106, the second P-well 206, and the third P-well 306), forming a gate electrode, a source electrode, and a drain electrode at each of the isolated-LDNMOS region, the non-isolated-LDNMOS region, and the LDPMOS region.

As can be appreciated from the foregoing discussion, embodiments of the invention may not require the three separate mask processes for forming a deep P-well, a P-drift region, and N-drift regions in the manner required in well-known methods. Advantageously, embodiments of the invention may significantly simplify semiconductor device manufacturing processes and may significantly reduce semiconductor device manufacturing costs.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
    preparing a semiconductor substrate that includes a first region for forming an isolated LDNMOS device, a second region for forming a non-isolated LDNMOS device, and a third region for forming an LDPMOS device;
    providing a first mask that overlaps the semiconductor substrate;
    etching, using the first mask, the semiconductor substrate to form a first trench in the first region, a second trench in the second region, and a third trench in the third region;
    providing a second mask that overlaps the semiconductor substrate and includes three openings respectively corresponding to the first region, the second region, and the third region;
    performing first ion implantation through the three openings to form a first P-doped region in the first region, a second P-doped region in the second region, and a third P-doped region in the third region;
    performing second ion implantation through the three openings to form a first N-doped region in the first region, a second N-doped region in the second region, and a third N-doped region in the third region;
    performing third ion implantation through the three openings to form a fourth N-doped region in the first region, a fifth N-doped region in the second region, and a sixth N-doped region in the third region; and
    forming a first isolation member in the first trench, a second isolation member in the second trench, and a third isolation member in the third trench.

2. The method of claim 1, wherein at least one of the three openings partially exposes the first mask.

3. The method of claim 1, wherein the first ion implantation provides an arsenic dopant and has a junction depth less than a thickness of the first mask in a direction perpendicular to the semiconductor substrate.

4. The method of claim 1, wherein the second ion implantation provides a phosphorus dopant.

5. The method of claim 1, wherein the third ion implantation provides a boron dopant and has a junction depth greater than the thickness of the first mask.

6. The method of claim 1, wherein the first mask includes a silicon nitride material, wherein the second mask includes a photoresist material, and wherein formation of the first isolation member, the second isolation member, and the third isolation member includes depositing a dielectric material in the first trench, the second trench, and the third trench and subsequently removing a portion of the dielectric material through a chemical-mechanical polishing process.

7. The method of claim 1, wherein the first N-doped region and the fourth N-doped region form an N-drift region of the isolated LDNMOS device.

8. The method of claim 1, wherein the first P-doped region forms a deep P-well of the isolated LDNMOS device.

9. The method of claim 1, wherein the second N-doped region and the fifth N-doped region form an N-drift region of the non-isolated LDNMOS device.

10. The method of claim 1, further comprising: forming a first deep N-well in the first region and a second deep N-well in the third region prior to formation of the first trench, the second trench, and the third trench.

11. The method of claim 1, further comprising:
    after formation of the first isolation member, the second isolation member, and the third isolation member, forming an N-well in the third region, forming a first P-well in the first region, forming a second P-well in the second region, and forming a third P-well in the third region, wherein the third P-well contacts the third P-doped region.

12. The method of claim 11, wherein the third P-well and the third P-doped region form a P-drift region of the LDPMOS device.

13. The method of claim 11, further comprising:
    after formation of the N-well, the first P-well, the second P-well, and the third P-well, forming a gate electrode, a source electrode, and a drain electrode at each of the first region, the second region, and the third region.

14. The method of claim 11, wherein the first P-well directly contacts at most one side of the first P-doped region, and wherein the second P-well directly contacts at most one side of the second P-doped region.

15. The method of claim 11, wherein a minimum distance between the N-well and a bottom surface of the semiconductor substrate is greater than a minimum distance between the third P-doped region and the bottom surface of the semiconductor substrate.

16. The method of claim 11, wherein at least one of the third N-doped region and the sixth N-doped region is positioned between the N-well and the third P-well.

17. The method of claim 11, wherein a portion of the third P-doped region is positioned between the N-well and the third P-well.

18. The method of claim 11, wherein positions of the three openings respectively overlap positions of the first trench, the second trench, and the third trench.

19. The method of claim 1, wherein the first N-doped region is positioned between the first P-doped region and the fourth N-doped region.

20. The method of claim 1, wherein the fourth N-doped region is positioned between the first isolation member and the first N-doped region.

* * * * *